(12) United States Patent
Volkov

(10) Patent No.: US 8,242,829 B1
(45) Date of Patent: Aug. 14, 2012

(54) MULTICHANNEL INTERPOLATOR

(75) Inventor: Oleksandr Volkov, Cork (IE)

(73) Assignee: ARRIS Group, Inc., Suwanee, GA (US)

( * ) Notice: Subject to any disclaimer, the term of this patent is extended or adjusted under 35 U.S.C. 154(b) by 236 days.

(21) Appl. No.: 12/822,725

(22) Filed: Jun. 24, 2010

Related U.S. Application Data

(60) Provisional application No. 61/220,052, filed on Jun. 24, 2009.

(51) Int. Cl.
*H03K 3/00* (2006.01)

(52) U.S. Cl. .......................... 327/291; 327/294; 327/298

(58) Field of Classification Search .................. 327/291, 327/293, 294, 298
See application file for complete search history.

(56) References Cited

U.S. PATENT DOCUMENTS

| | | | |
|---|---|---|---|
| 7,616,042 B2 * | 11/2009 | Suzuki | 327/291 |
| 7,652,516 B2 * | 1/2010 | Bourstein et al. | 327/291 |
| 8,008,961 B2 * | 8/2011 | Garg et al. | 327/291 |

* cited by examiner

*Primary Examiner* — Hai L Nguyen
(74) *Attorney, Agent, or Firm* — Troy A. Van Aacken; Robert J. Starr

(57) ABSTRACT

Methods, systems, and apparatus can provide a multichannel interpolator while optimizing circuitry reuse.

21 Claims, 3 Drawing Sheets

MULTICHANNEL INTERPOLATOR

RELATED APPLICATIONS

This application claims priority as a non-provisional utility of U.S. Provisional Patent Application Ser. No. 61/220,052, entitled "Multichannel Interpolator," filed Jun. 24, 2009, which is incorporated herein by reference in its entirety.

TECHNICAL FIELD

This disclosure relates to a multichannel data interpolator.

BACKGROUND

Data interpolation is a common operation in many DSP algorithms. One target of the data interpolation is to change a signal sampling frequency. Data interpolation can also be referred to as re-sampling. Interpolation or re-sampling can be performed when a digital signal was created with a sampling frequency that is natural for that signal. For example, QAM (quadrature amplitude modulation) signals for cable or wireless communication systems can be created by sampling at twice the symbol rate frequency. After the digital signal is created, the digital signal can be transmitted with another sampling frequency, which can be defined by using a clock frequency. Typically, a communication system has a single clock frequency, while the symbol rate is programmable. A system can therefore be capable of converting data from any symbol rate to that single clock frequency. An interpolator (or re-sampler) can be used to provide the conversion.

An interpolation procedure can assume that each point of an output signal is produced on the basis of N points of an input signal, located before and after a desired output point. For example, if just two points are in use, a desired point between the two points could be calculated using linear interpolation. The desired point would belong to a direct line, connecting the two input signal points.

SUMMARY

Systems and methods of this disclosure can operate to provide a multichannel data interpolator. Example methods can include the steps of: generating a select signal and a plurality of output clocks based on an input clock representing a multichannel interpolated output signal frequency multiplied by a number of channels; generating a first stage multiplexer output between a multichannel input signal and a first stage shift register output based on the select signal; generating a first stage shift register output based on said input clock and the first stage multiplexer output; generating a next stage multiplexer output from between a previous stage shift register output and a next stage shift register output based on said select signal; generating a next stage shift register output by one or more next stage shift registers, having a length correlating with the number of channels, with said input clock and wherein the number of shift registers and multiplexers is based upon a number of interpolation points; multiplying associated shift register outputs with a impulse response coefficient; and adding the multiplier outputs thereby generating the multichannel interpolated output signal.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A continuous time signal S(t) can be represented by and recovered from samples equally spaced in time using a theoretical perfect low-pass filter as well as other common techniques that are well-known to one of ordinary skill in the art. Any point of signal S(t) with limited bandwidth B can be expressed via signal samples according to Nyquist theorem:

$$S(t) = \sum_{k=-\infty}^{\infty} S(k\delta) \mathrm{sinc}\left[2\pi\left(\frac{t}{\delta} - k\right)\right], \quad (1)$$

where $\delta \leq \frac{1}{2}B$ defines sampling frequency $F_S = 1/\delta$

In case of re-sampling, point $S(k\tau)$ are produced, where $\tau$ is a period of a new sampling frequency, based on points $S(k\delta)$:

$$S(n\tau) = \sum_{k=-N/2}^{N/2-1} S(k\delta) \mathrm{sinc}\left[2\pi\left(\frac{n\tau}{\delta} - k\right)\right], \quad (2)$$

where $$\mathrm{sinc}(x) = \frac{\sin(x)}{x}$$

In formula (2), the number of points in the sum is limited by N. Formula (2) describes a finite impulse response (FIR) filter with an input signal $S(k\delta)$, N taps and the impulse response:

$$H(k) = \mathrm{sinc}\left[2\pi\left(\frac{k\tau}{\delta}\right)\right]. \quad (3)$$

Direct realization of formula (2) can be implemented using a tree FIR structure, where the impulse response coefficients (3) are stored in a look up table. The main difference of this FIR filter from conventional implementations is that the impulse response coefficients (3) are changing from point to point of the output signal (because $\tau$ in (3) is changing).

Figure 1:
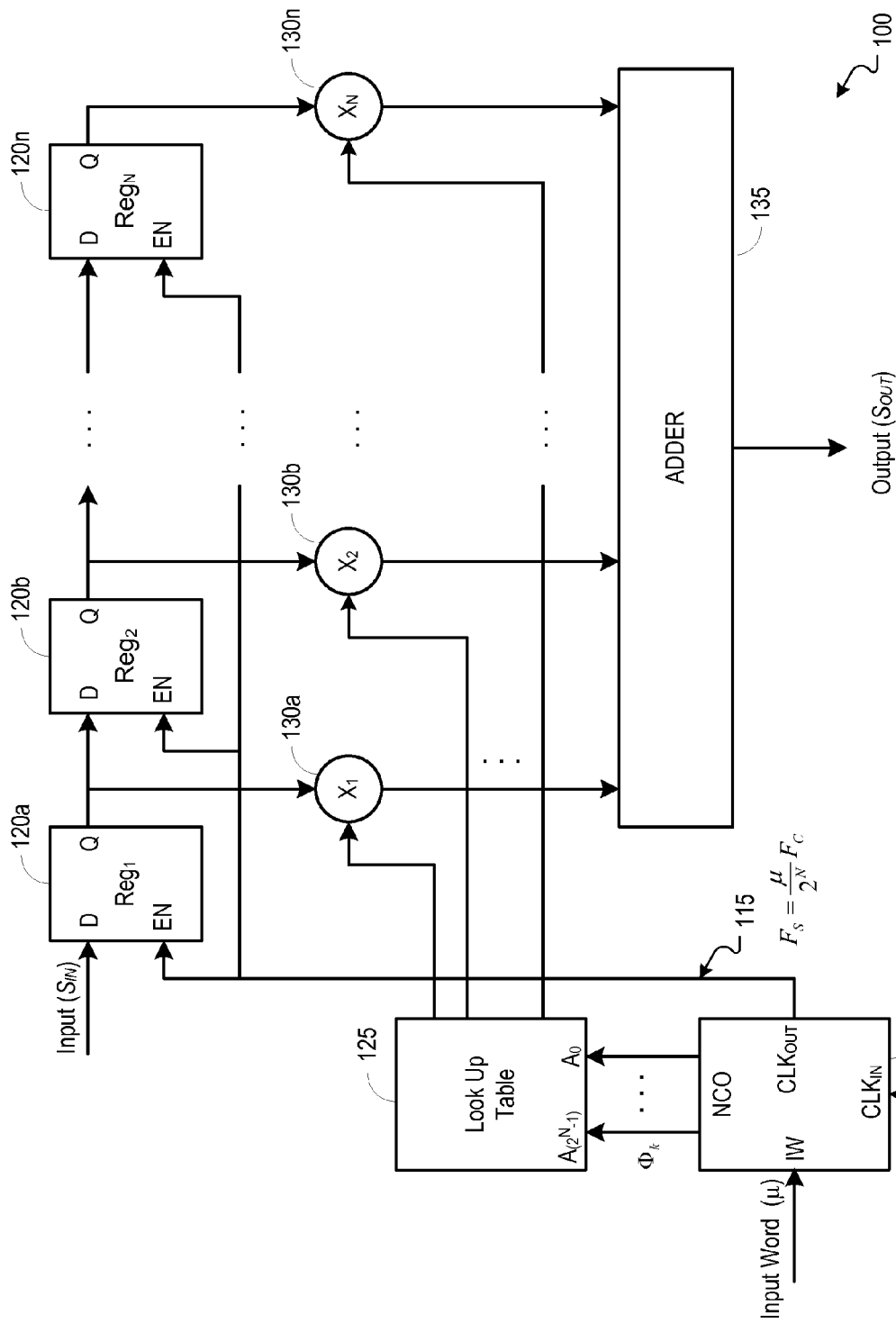
FIG. 1 is a block diagram illustrating an example of a single channel data interpolator.

FIG. 1 is a block diagram illustrating an example of a classical single channel interpolator or re-sampler based on using the sinc(x) function.

The single channel data interpolator in some implementations can use one system clock frequency of $F_C = 1/\tau$. The single channel data interpolator can include a numeric controlled oscillator device 110 (NCO). The NCO device 110 can be used to generate an input sampling clock 115 where the input sampling frequency $F_S = 1/\delta$ is different from the system clock where $F_S < F_C$.

NCO device 110 can include an N-bit accumulator implementing the algorithm described by formula (4)

$$\Phi_k = \Phi_{k-1} + \mu, \quad (4)$$

where $\mu$ is an input word. The accumulator can work on the basis of modulus $2^N$, so a maximum value of $\Phi_k$ would be $2^N-1$ where N can represent the number of interpolator points. The NCO device 110 output frequency 115 $F_S$, can be an average frequency defined by the event when $\Phi_k < \Phi_{k-1}$. Thereby, it can be shown that:

$$F_S = \frac{\mu}{2^N} F_C \quad (5)$$

If $\mu=1$ then $$F_S = \frac{F_C}{2^N}$$

and the accumulator is merely a simple counter. The output frequency 115, $F_S$ can be represented by a carry out signal of the counter. Thus, the average output frequency 115 of the NCO device 110 would be $F_S$.

The output frequency 115 can be used be used to generation samples $S(k\delta)$. The output frequency 115 signal could be described as:
  1 when $\Phi_k < \Phi_{k-1}$,
  0 in other cases.
Thus, the effective frequency of input signal change would be $F_S$. The output frequency signal 115 can be used to sample and shift the input signal with register devices 120a-120n. The set of $S(k\delta)$ bits moves by one step ahead, to the next register device 120, on the active edge/level of output frequency 115.

In one implementation, according to (4) and (5) the value $\Phi_k$ under the condition $\Phi_0=0$ could be expressed as $$\Phi_k = \mu \times k = \frac{k\tau}{\delta} 2^N$$

and can be used as an address for the lookup table 125 providing coefficients outputs derived from Equation (3) to multiplier devices 130a-n. Multiplier devices 130a-n can multiple the set of values $S(k\delta)$ from register devices 120a-120n with response coefficients outputs of one bit from lookup table 125 and can provide to adder device 135 thereby generating the output signal. In some implementations, impulse response coefficients of two or more bits in size can represent a preferred mode of operation. Lookup table 125 can be implemented in non-volatile memory or loadable volatile memory technologies.

The input and output signals of the single channel interpolator can be one or more bits to meet the precision requirements of the interpolator. Thereby, the data path through the shift registers devices 120a-n, multiplier devices 130a-n and adder device 135 can be one or more bits in width. In some implementations, two or more bits can represent a preferred mode of operation.

The NCO device 110, lookup table device 125, multiplier device 130a-n and adder device 135 outputs can change with each clock active edge/level. Thus, the frequency of the output signal is $F_C$, and re-sampling is achieved.

Figure 2:
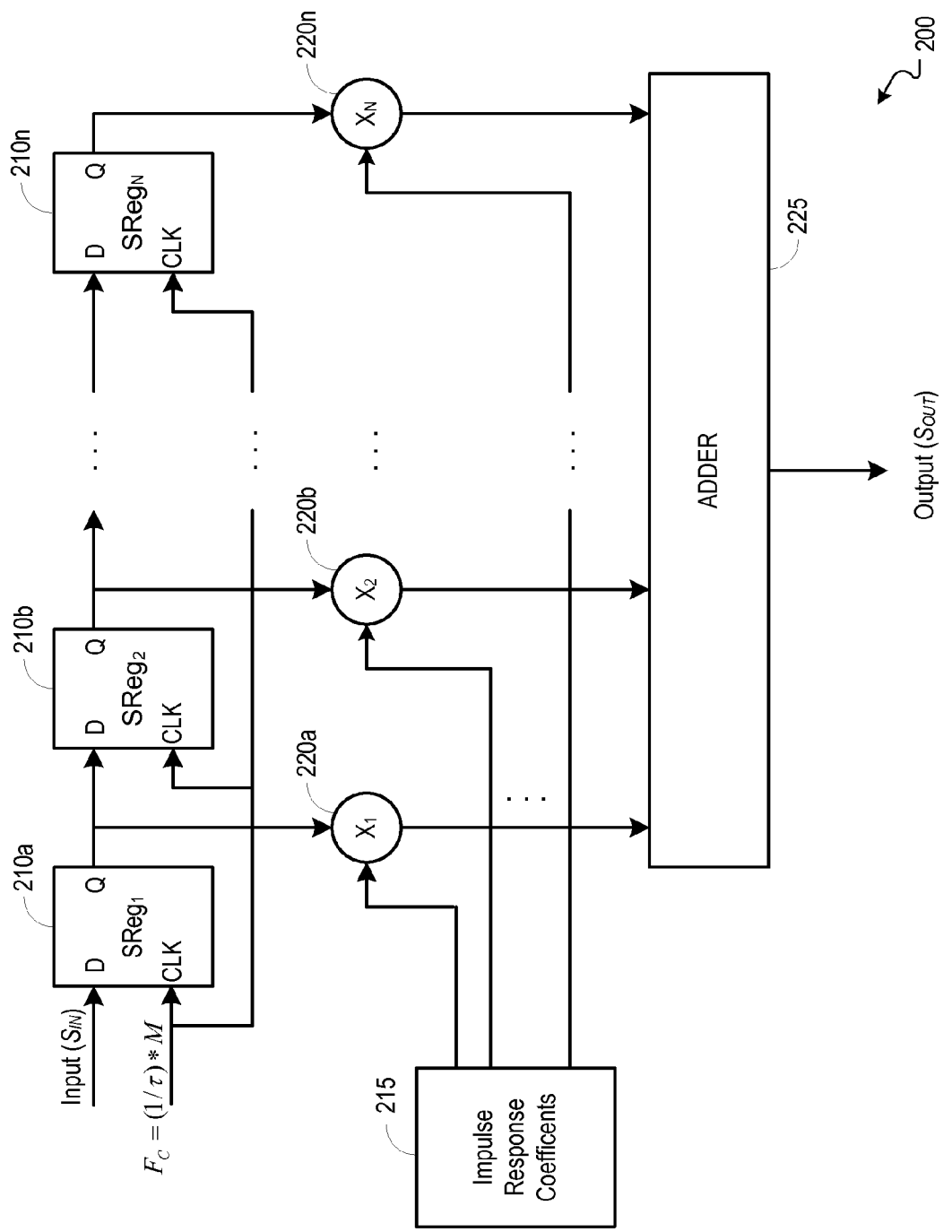
FIG. 2 is a block diagram illustrating an example of a multichannel finite impulse response filter.

FIG. 2 is a block diagram illustrating an example of a multichannel FIR filter. Modern wired and wireless communication systems can be multichannel systems. In one implementation of a multichannel FIR filter the same blocks can be used for multiple channels. For example, if there are a number of channels, M, a clock frequency of multichannel system can be $F_C \times M$. One difference from the single channel interpolator filter is that each register can be multiple stage registers. Shift register devices 210a-n can have length M, corresponding to the number of channels, instead of the single stage register devices (e.g., register devices 120a-n of FIG. 1) used for the single channel interpolator.

An input signal can include a sequence of frames, and each frame can contain M serial samples of the channels 1, 2, 3, . . . , M. Thus, the input signal frame is $S_1(k\tau)$, $S_2(k\tau)$, $S_3(k\tau)$, . . . , $S_M(k\tau)$. The next frame can be the same sequence for k+1, and the next for k+2, etc. The outputs of shift register devices 210a-210n can advance on the next active frequency $F_C \times M$ clock edge/level to the next channel.

On each active edge/level of clock $F_C \times M$ multiplier devices 220a-220n can multiply the shift register devices 210a-n outputs with the impulse response coefficients of one bit in size, provided by impulse response coefficient device 215. In some implementations, response coefficients of two or more bits in size can represent a preferred mode of operation. Impulse response device 215 can be a programmable register.

The outputs multiplier devices 220a-n can be provided to adder device 225 for summing to produce the output signal. The output signal can change on every active edge/level of clock $F_C \times M$. The sharing of adder and multipliers can optimize ASIC (application specific integrated circuit), FPGA (field programmable gate array), or other technology based implementations.

Figure 3:
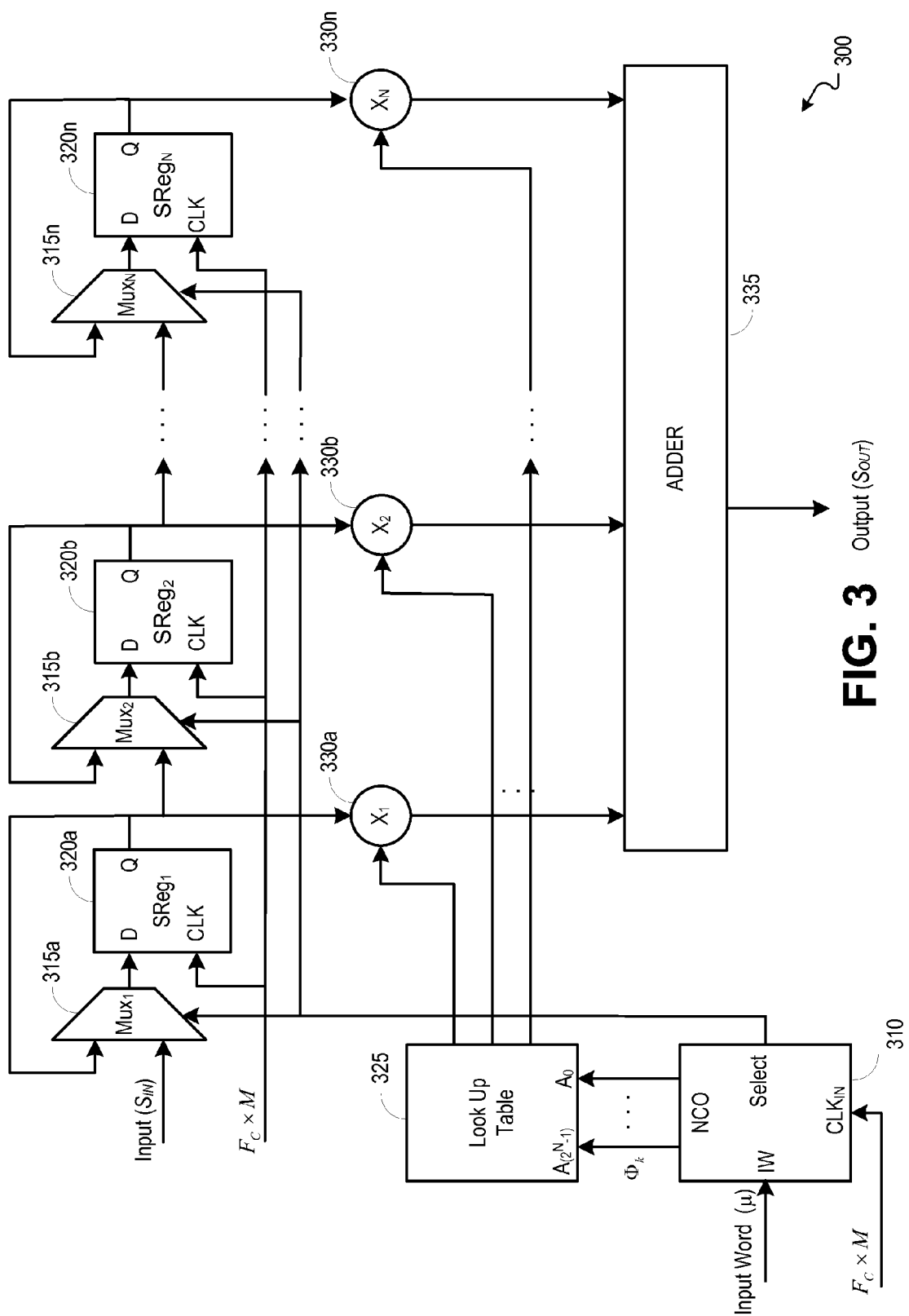
FIG. 3 is a block diagram illustrating an example of a multichannel data interpolator.

FIG. 3 is a block diagram illustrating an example of a multichannel data interpolator. In some implementations, a multichannel interpolator can provide an execution of formula (2) for each vector of data $[S_M(k\delta)]$, where $k=-N/2, \ldots, +N/2$, and where M is number of channels. The interpolator output signal structure is a sequence of frames; each frame contains M serial samples of the channels 1, 2 . . . M. A multichannel interpolator can share an adder and multipliers, similar to the sharing of an adder and multipliers of a filter in FIG. 2 and thereby optimizing the implementation.

The multiple channel data interpolator can include a numeric controlled oscillator device 310 (NCO). The NCO device 310 can receive an input clock frequency $F_C \times M$ and divide the clock by M (not shown) thereby generating a clock frequency of $F_C$. The select signal can be generated by a clock $F_C$. The accumulator can work on the basis of modulus $2^N$, so a maximum value of $\Phi_k$ would be $2^N-1$, where N can represent the number of interpolator points. The select inputs on multiplexer devices 315a-n can be provided by the carry out signal of the counter provided by NCO device 310. The NCO device 310 can be clocked by the frequency $F_C$, the select signal comprises a sequence of intervals of active or inactive states, where the length of each interval equals M (i.e. number of channels) clock cycles.

If the select signal is active each multiplexer device 315b-n can connect the output of previous shift register device 320b-n to the input of the next shift register device 320b-n, where multiplexer device 315a connects the input signal to the input of shift register device 320a.

If select signal is inactive each multiplexer device 310a-n can connect the output of each shift register device 320a-n to its input. Thus, the current frame circulates in shift register devices 320a-n and corresponding multiplexer devices 310a-n, respectively, until a new valid frame is followed by an active select signal. The active select signal can be asserted by the NCO device 310.

If a new valid frame is received by the multichannel interpolator, all frames will move one shift register device 320a-n ahead during the time when select is active. The length of the shift register devices 320 can be determined by the number of channels M and clocked by the frequency $F_C \times M$.

In one implementation, the value of $\Phi_k$ can be used as an address for the lookup table 325 providing coefficients outputs to multiplier devices 330a-n. Multiplier devices 330a-n can multiply the set of values $[S_M(k\delta)]$ from shift register devices 320a-320n with the coefficients outputs from lookup table 325 and can provide adder device 335 thereby generating the output signal. Lookup table 325 can be implemented in non-volatile memory or loadable volatile memory technologies.

The input and output signals of the multichannel interpolator can be one or more bits to meet the precision requirements of the interpolator. Thereby, the data path through the multiplexer devices 315a-n, shift registers devices 320a-n, multiplier devices 330a-n and adder device 335 can be one or more bits in width. In some implementations, two or more bits can represent a preferred mode of operation.

The NCO device 310 signals $\Phi_k$, multiplexer devices 310a-n and lookup table device 325 outputs can change with each frequency $F_C$ clock active edge/level. Each of the signals from the shift register devices 320a-n, multiplier devices 330a-n and adder device 335 can change with each frequency $F_C \times M$ clock active edge/level. Thereby, the frequency of the output signal is $F_C \times M$, and re-sampling is achieved. The sharing of adder and multipliers can optimize ASIC (application specific integrated circuit), FPGA (field programmable gate array), or other technology based implementations.

What is claimed:

1. A system, comprising:
   clock generator circuitry operable to receive an input clock representing a multichannel interpolated output signal frequency multiplied by a number of channels, generating a select signal and a plurality of output clocks;
   a first stage multiplexer operable to receive a multichannel input signal for sampling and a first stage shift register output, a first stage multiplexer output being based on the select signal;
   a first stage shift register operable to receive the first stage multiplexer output, said first stage shift register operable with said input clock to provide the first stage shift register output, said first stage shift register having a length that correlates to the number of channels;
   one or more next stage multiplexers operable to receive a previous stage shift register output and a respective next stage shift register output, the one or more next stage multiplexer outputs being based on a select signal;
   one or more next stage shift registers operable to receive a respective next stage multiplexer output and the said input clock, and to provide the respective next stage shift register output, said one or more next stage shift registers being the length of the first stage shift register, and wherein the number of shift registers and multiplexers is based upon a number of interpolation points;
   a data store operable to provide impulse response coefficient;
   a plurality of multipliers operable to multiply associated shift register output with impulse response coefficient; and
   an adder operable to sum multiplier outputs thereby generating the multichannel interpolated output signal.

2. The system of claim 1, wherein the clock generator circuitry is further operable to provide the select signal, at a rate lower than the input clock, to the multiplexer circuitry based on a carry out of a modulus $2^N$ accumulator incremented by an input word of one or more bits.

3. The system in claim 2, wherein the clock generator circuitry is further operable to provide the accumulator bits to address the impulse response coefficients in the data store.

4. The system of claim 1, wherein the data store is operable to provide impulse response coefficients to the multiplier circuitry associable with shift register outputs.

5. The system of claim 1, wherein the data store is operable to provide the impulse response coefficients one bit in size.

6. The system of claim 1, wherein the data store is operable to provide the impulse response coefficients two or more bits in size.

7. The system of claim 1, wherein the data store is implemented with programmable volatile memory.

8. The system of claim 1, wherein the data store is implemented with non-volatile memory.

9. The system of claim 1, wherein the input signal, multiplexer, shift register, multiplier and adder circuitry are operable with a width of one bit.

10. The system of claim 1, wherein the input signal, multiplexer, shift register, multiplier and adder circuitry operable with a width of two or more bits.

11. The system of claim 1, wherein the multichannel input signal to the first stage multiplexer is a QAM (quadrature amplitude modulation) based signal.

12. A method comprising:
    generating a select signal and a plurality of output clocks based on an input clock representing a multichannel interpolated output signal frequency multiplied by a number of channels;
    generating a first stage multiplexer output between a multichannel input signal and a first stage shift register output based on the select signal;
    generating a first stage shift register output based on said input clock and the first stage multiplexer output;
    generating a next stage multiplexer output from between a previous stage shift register output and a next stage shift register output based on said select signal;
    generating a next stage shift register output by one or more next stage shift registers, having a length correlating with the number of channels, with said input clock and wherein the number of shift registers and multiplexers is based upon a number of interpolation points;
    multiplying associated shift register outputs with a impulse response coefficient; and
    adding the multiplier outputs thereby generating the multichannel interpolated output signal.

13. The method of claim 12, further comprising:
    generating the select signal, at a rate lower than the input clock, based on a carry out of a modulus $2^N$ accumulator; and
    incrementing the accumulator by an input word of one or more bits.

14. The method of claim 12, further comprising:
    providing accumulator bits to address the impulse response coefficients in the data store.

15. The method of claim 12, further comprising:
    providing the impulse response coefficients to multiplier circuitry associable with shift register outputs.

16. The method of claim 12, further comprising:

providing the impulse response coefficients to the multiplier circuitry associable with shift register outputs.

17. The method of claim 12, further comprising:

providing the impulse response coefficients one bit in size.

18. The method of claim 12, further comprising:

providing the impulse response coefficients two or more bits in size.

19. The method of claim 12, further comprising:

storing impulse response coefficients with programmable volatile memory.

20. The method of claim 12, further comprising:

storing impulse response coefficients with programmable non-volatile memory.

21. The method of claim 12, further comprising:

receiving a QAM (quadrature amplitude modulation) based input signal.

* * * * *